United States Patent
Atireklapvarodom et al.

(10) Patent No.: US 6,806,035 B1
(45) Date of Patent: Oct. 19, 2004

(54) WAFER SERIALIZATION MANUFACTURING PROCESS FOR READ/WRITE HEADS USING PHOTOLITHOGRAPHY AND SELECTIVE REACTIVE ION ETCHING

(75) Inventors: Thanawatana Atireklapvarodom, Pathumthani (TH); Richard D. Anderson, Sunnyvale, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 121 days.

(21) Appl. No.: 10/180,202

(22) Filed: Jun. 25, 2002

(51) Int. Cl.$^7$ .............................. G03C 5/00; G03F 9/00; B44C 1/22
(52) U.S. Cl. ...................... 430/313; 430/318; 430/311; 430/329; 430/317; 438/401; 438/462; 216/72; 216/76; 216/77
(58) Field of Search ................................. 430/311, 313, 430/318, 329, 317, 5, 322, 323; 216/72, 76, 77; 438/401, 462, 975; 257/797

(56) References Cited

U.S. PATENT DOCUMENTS

| | | | | |
|---|---|---|---|---|
| 4,853,317 A | * | 8/1989 | Hayes | 430/318 |
| 5,302,491 A | | 4/1994 | Aklyas et al. | 430/311 |
| 2002/0031732 A1 | * | 3/2002 | Shoji | 430/396 |
| 2002/0153620 A1 | * | 10/2002 | Guldi et al. | 257/797 |

* cited by examiner

Primary Examiner—John A. McPherson
Assistant Examiner—Daborah Chacko-Davis

(57) ABSTRACT

A serialization process presents an efficient method of creating serial numbers on a ceramic-like semiconductor wafer by forming a non-rigid photomask that incorporates character specifications for the serial numbers. The non-rigid photomask is retained in a rigid, optically transparent photomask holder that enables the photomask to be handled as a rigid structure. Upon preparation of the wafer, the serial numbers are created onto wafer dies using a combined process involving photolithography, and a reactive ion etching process with a selective etch rate. The serialization process enables a rapid creation of serial numbers, with the selective RIE process substantially increasing the optical contrast of the characters without the need for deep trenches and without generation of excessive debris.

27 Claims, 13 Drawing Sheets

FIG. 6

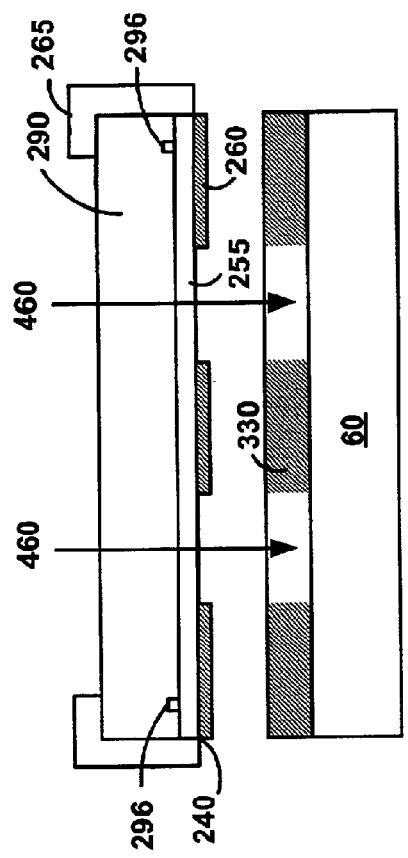
FIG. 11B
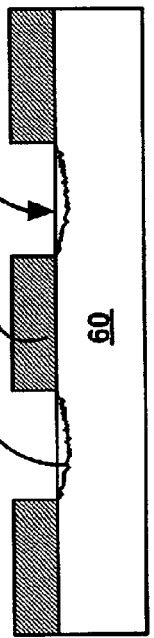
FIG. 11D
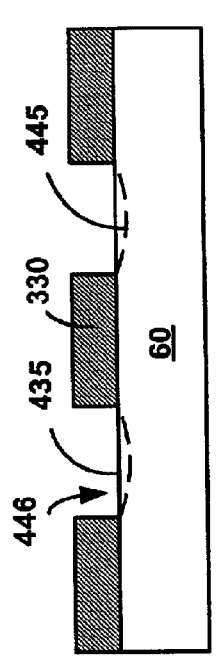
FIG. 11A
FIG. 11C
FIG. 11E
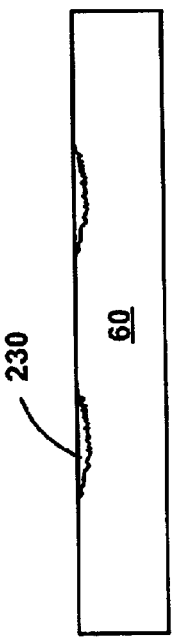

WAFER SERIALIZATION MANUFACTURING PROCESS FOR READ/WRITE HEADS USING PHOTOLITHOGRAPHY AND SELECTIVE REACTIVE ION ETCHING

FIELD OF THE INVENTION

The present invention relates in general to a serialization process for creating serial numbers of commercial products and in particular to a serialization process for a semiconductor wafer used in the manufacturing of thin film read/write heads of magnetic storage disk drives. The enhanced serialization process of the present invention utilizes a photolithography process in combination with a selective reactive ion etching process to rapidly create serial numbers of high optical contrast without causing undesirable deep trenches forming characters.

BACKGROUND OF THE INVENTION

In a conventional magnetic storage system, a thin film magnetic head includes an inductive read/write transducer mounted on a slider. The magnetic head is mechanically coupled to a rotary actuator magnet and voice coil assembly by a miniature suspension and a gimbal assembly which is attached to an actuator arm positioned over a surface of a spinning magnetic disk. The slider design incorporates an air bearing surface to control the aerodynamic interaction between the magnetic head and the spinning magnetic disk thereunder. Air bearing surface (ABS) sliders used in disk drives typically have a leading edge surface and a trailing edge surface onto which thin film read/write heads are deposited.

In general, sliders are typically manufactured using a process involving a wafer made of a ceramic-like material such as $A_2O_3TiC$. The surface area of the wafer is generally divided into rectangular bars, which are usually referred to as slider bars that adjoin one another lengthwise. Each slider bar is further comprised of sliders adjoining one another along the length of the slider bar. In a conventional thin film head wafer process, the trailing edge surfaces of the sliders corresponds to the front side (or top side) of the wafer whereupon the read/write heads are further formed by various thin film processes. Thus, the backside of the wafer establishes the leading edge surfaces of the sliders.

In a conventional thin film head manufacturing sequence, read/write elements are placed onto the front side of the wafer in small rectangular areas that form the trailing edge surfaces of the sliders. These small rectangular areas are also referred to as dies. Upon forming the read/write elements, the wafer is diced into slider bars, each containing a row of sliders adjoining one another. The slider bars then undergo further processing. Initially, the ABS surfaces of the sliders are revealed by the dicing process, along the surface that represents the thickness of the wafer. Further processing is required to polish the ABS and to impart patterns that control the fly-height of the slider over the spinning magnetic disk. Thereafter, the sliders bars are sliced into individual sliders ready for the assembly sequence to form read/write heads-suspension assemblies (HSA).

As is common in mass production processes, a system of traceability usually must be established in order to provide a means for identifying the manufactured sliders. This identification process can be used for various process controls such as inventory control, quality assurance, etc. Such a traceability system usually exists in a form of permanent imprints of serial numbers created onto the leading edge surfaces of the manufactured sliders. Further, the characters of the serial numbers must be accurately read and recorded in an automated fashion. Hence, each character string must satisfy stringent Optical Character Recognition (OCR) rules and requirements. Thus, the serialization process forms an integral part of the manufacturing operation of the sliders at the wafer level.

One such conventional serialization process utilizes a laser scribing method. This process involves creating permanent imprints of serial numbers by a laser source onto the die areas of the ceramic substrate on the backside surface of the wafer. The laser source removes the substrate material by heat, known as ablation, to form characters constituting a serial number for each die. Because of heat generation, the laser scribing method suffers a number of disadvantages.

One of the significant problems with the laser scribing method is associated with potential wafer distortion due to heating by the laser energy, which may lead to damages to the slider and read/write devices. This distortion is caused by the thermal stresses induced onto the wafer surface as a result of the laser energy imparted on the backside of the wafer, thereby adversely affecting the desired flatness of the wafer. Furthermore, the flatness of the wafer is also affected by the surface stresses induced by the high density of characters forming on the die. The resulting distortion leads to subsequent manufacturing problems such as during photolithography, chemical mechanical polishing (CMP), etc. Additionally, if this serialization is performed after the fabrication of the read/write head element has been completed, such stresses could cause a degradation of the magnetic performance.

Another disadvantage associated with the laser scribing process is the deep trenches and loosely adherent re-melted material (slag) that form the characters acting as a reservoir for collecting debris generated during the ablation process an all subsequent processing, including slider-level processes. In addition, the loosely adherent slag represents a potential source of debris. In order to provide a sufficient optical contrast in the imprinted characters, the laser scribing process must create a sufficiently deep impression of the characters onto the backside of the wafer. The debris collected in this deep impression and the slag generated during the laser scribing process may therefore pose a reliability problem to the sliders and disk drive product as the debris and slag may loosen and become airborne and potentially interfere with the physical spacing between the flying slider and the spinning magnetic disk. The airborne particle can cause the magnetic data storage disk damage from the scratch during the disk rotation and potentially complete failure of the disk drive product.

Yet, another significant problem with the laser scribing method lies with the fact that this process is extremely slow, thus posing a significant manufacturing disadvantage. Because the laser scribing method is sequential, that is, characters are imprinted onto the die areas one at a time at an approximate rate of 12 characters per second, the serialization of each wafer may take up to 7 to 8 hours, since there are about 40000 dies per wafer with each die requiring about 8 characters.

A further disadvantage of the laser scribing method is the limitation on the character size and shape as dictated by the optics of the laser system and the dimensioning ability to meet the stringent OCR rules as character size decrease. Consequently, the serialization process using the laser scribing method is restricted to the backside of the wafer, since the characters formed by the laser scribing method would be too large to be accommodated by the limited surface area available of the front side of the wafer on which read/write elements are formed and too poor in character quality when attempting to scribe characters of requisite dimensions.

Another conventional serialization process uses a photolithography method to create characters on the front side of the wafer. While this method is advantageous to the laser scribing process in the ability to form smaller characters for the front side of the wafer, its disadvantages sufficiently offset its benefits. One such disadvantage is that the photolithography serialization method requires a process integration by adding more processing steps in depositions, photolithography, and precision etching in addition to the fabrication and use of expensive photomasks, thus resulting in an additional manufacturing complexity and hence increased manufacturing cost of the sliders.

Because of its ability to form smaller characters onto the front side of the wafer, the demand for more exacting methods and tooling is of a paramount importance for the photolithography serialization method. Hence, this results in a greater emphasis in high precision and expensive equipment to produce small-dimensioned characters with tight tolerances that would fit into a small surface area of the front side of the wafer, an area that shrinks disproportionately to reductions in slider size as in from Pico to Femto formats and beyond.

In light of the foregoing unresolved concerns with the conventional serialization techniques, there remains an unsatisfied need for an improved, fast serialization method. The serialization method should not require high precision, special expensive equipment, or special and expensive photomasks to produce small character sizes. Moreover, it should provide a means for enhancing the optical character contrast for sufficient OCR readability without the necessity for creating deep trenches onto the surface of the wafer.

SUMMARY OF THE INVENTION

In order to resolve the foregoing problems with the conventional serialization methods, it is a feature of the present invention to provide a new, enhanced serialization method. The enhanced serialization method utilizes a combined process involving photolithography with a unique selective reactive ion etching (RIE) process to produce a low cost, manufacturing efficient process for creating characters on the wafer at a high optical contrast level without causing deep trenches. In particular, the present invention realizes several advantages, among which are the following:

1. A low cost manufacturing process involving a non-rigid photomask generated by a laser plotter to create character specification for the wafer serialization pattern;
2. An alignment and exposure system to secure and retain the non-rigid photomask for creating the serialization pattern onto the wafer surface; and
3. A unique selective reactive ion etching (RIE) process that targets a certain chemistry of the substrate to produce a high optical contrast on the character imprints.

The new serialization process of the present invention offers several manufacturing advantages that overcome the deficiencies in the conventional serialization processes. The resulting manufacturing advantages translate into a significant reduction in wafer production time and cost, thereby leading to a shorter product cycle time and competitive pricing.

BRIEF DESCRIPTION OF THE DRAWINGS

The features of the present invention and the manner of attaining them, will become apparent, and the invention itself will be understood by reference to the following description and the accompanying drawings, wherein:

FIG. 6 is an illustration of a non-rigid film for making the photomask according to the photomask process of FIG. 5;

FIG. 11 is an illustration of the exposure and development process for creating the character impression onto the wafer of FIG. 3.

Similar numerals in the drawings refer to similar elements. It should be understood that the sizes of the different components in the figures might not be in exact proportion, and are shown for visual clarity and for the purpose of explanation.

DETAILED DESCRIPTION OF PREFERRED EMBODIMENTS

Figure 1:
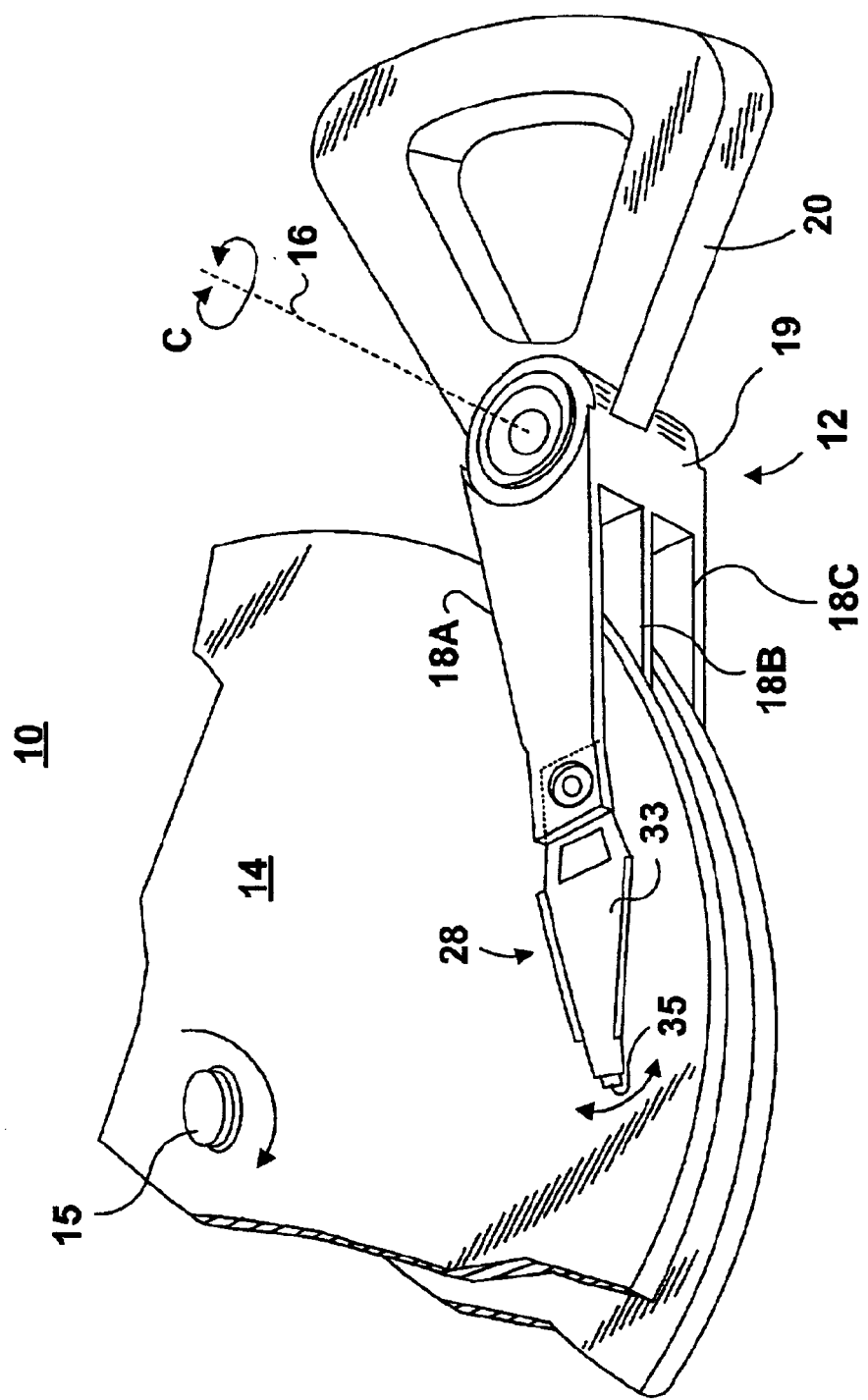
FIG. 1 is a fragmentary perspective view of a data storage system utilizing a read/write head.

FIG. 1 illustrates a disk drive 10 comprised of a head stack assembly 12 and a stack of spaced apart magnetic data storage disks or media 14 that are rotatable about a common shaft 15. The head stack assembly 12 is rotatable about an actuator axis 16 in the direction of the arrow C. The head stack assembly 12 includes a number of actuator arms, only three of which 18A, 18B, 18C are illustrated, which extend into spacings between the disks 14.

The head stack assembly 12 further includes an E-shaped block 19 and a magnetic rotor 20 attached to the block 19 in a position diametrically opposite to the actuator arms 18A, 18B, 18C. The rotor 20 cooperates with a stator (not shown) for rotating in an arc about the actuator axis 16. Energizing a coil of the rotor 20 with a direct current in one polarity or the reverse polarity causes the head stack assembly 12, including the actuator arms 18A, 18B, 18C, to rotate about the actuator axis 16 in a direction substantially radial to the disks 14.

Figure 2:
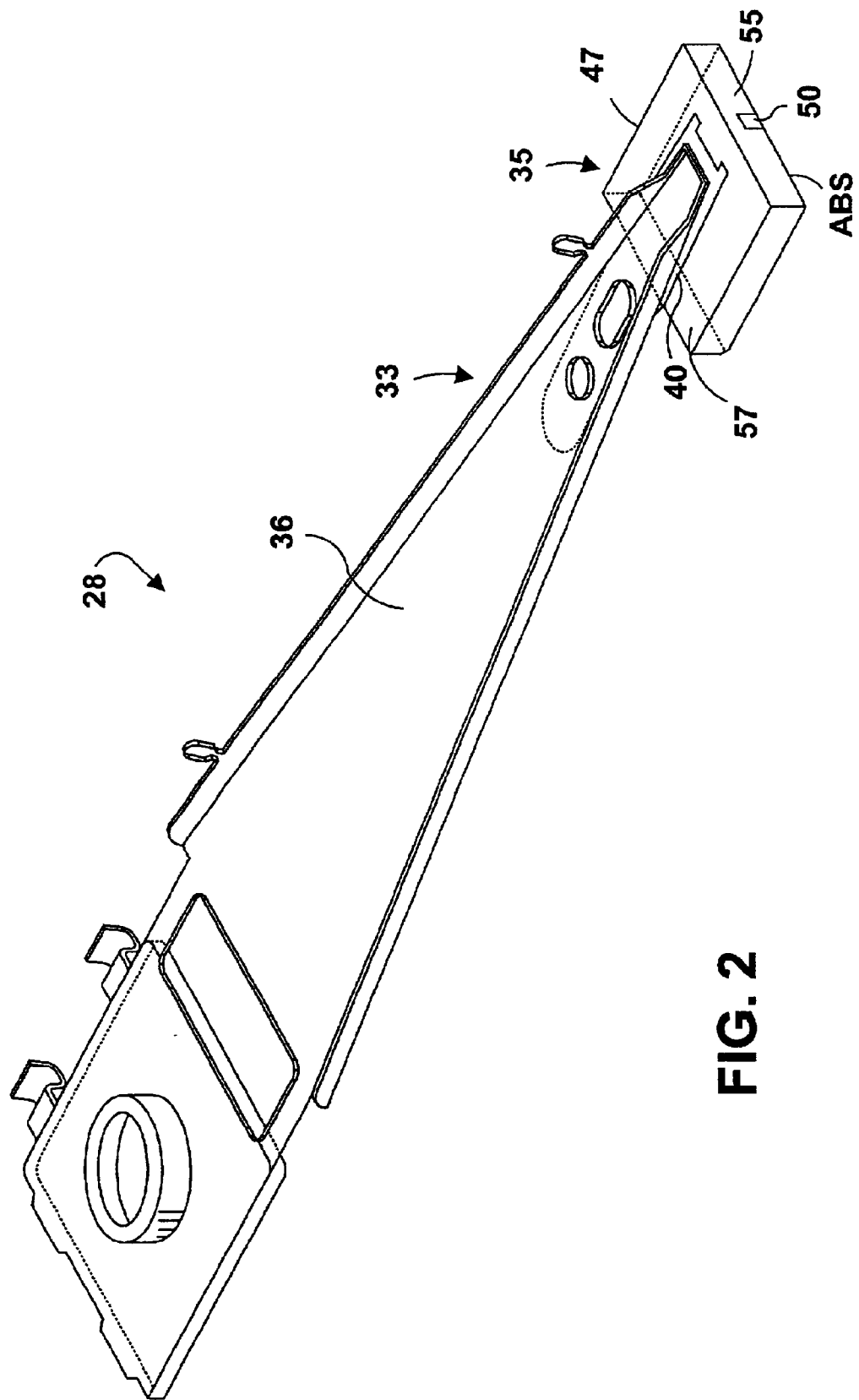
FIG. 2 is a perspective view of a head gimbal assembly comprised of a suspension, and a slider to which the read/write head of FIG. 1 is secured, for use in a head stack assembly.

A head gimbal assembly (HGA) 28 is secured to each of the actuator arms, for instance 18A. With reference to FIG. 2, the HGA 28 is comprised of a suspension 33 and a read/write head 35. The suspension 33 includes a resilient load beam 36 and a flexure 40 to which the head 35 is secured.

The head 35 is formed of a slider 47 secured to the free end of the load beam 36 by means of the flexure 40, and a read/write element 50 supported by the slider 47. The read/write element 50 is secured to the trailing edge 55 of the slider 47 so that its forwardmost tip is generally flush with the ABS of the slider 47. Located opposite to the trailing edge 55 of the slider 47 is the leading edge surface 57, which is free of any physical device attached thereto.

Figure 3:
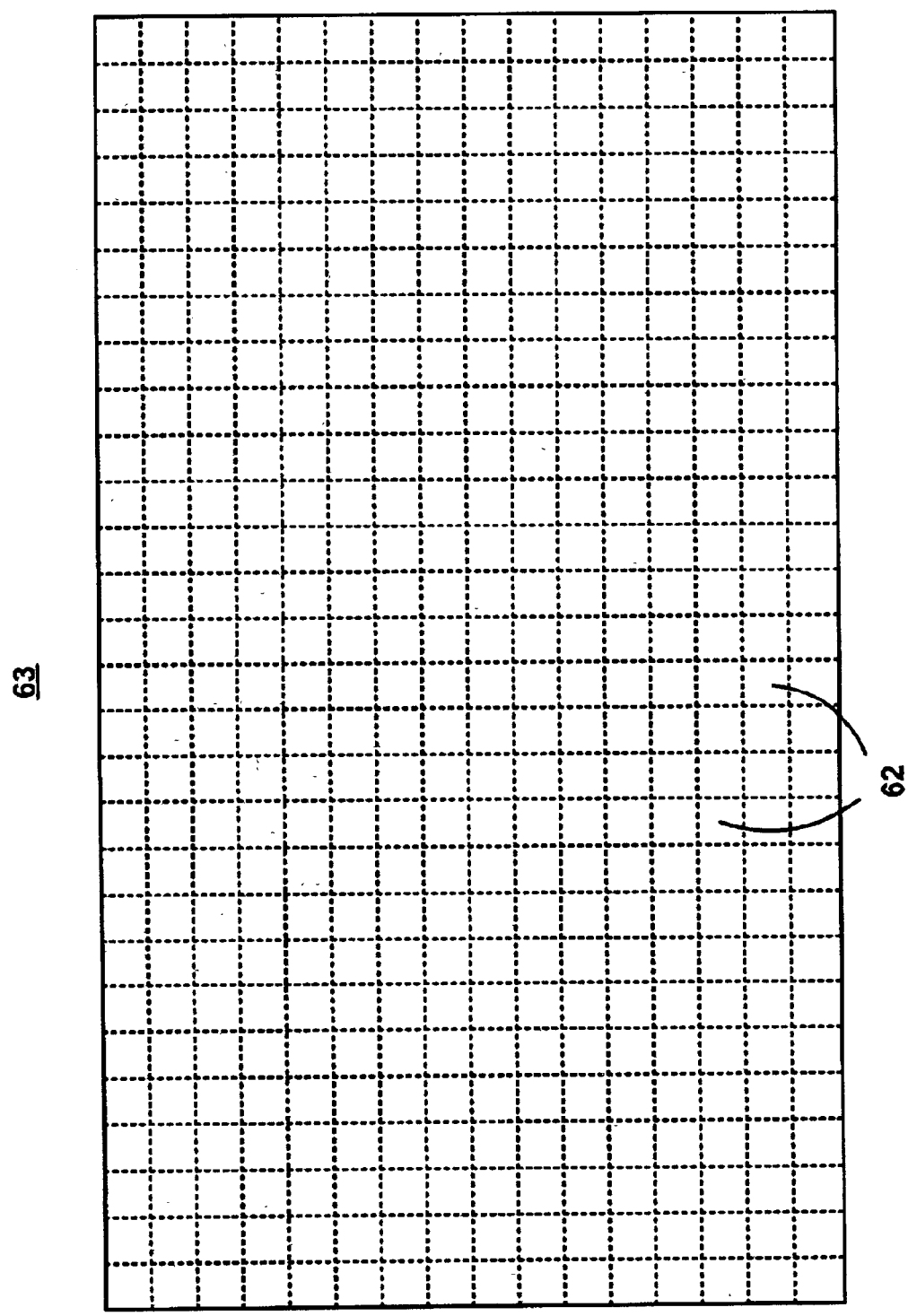
FIG. 3 is a top view of a conventional wafer for the manufacturing of sliders of FIG. 3.

With reference to FIG. 3, a wafer 60 having a square, a circular, or any other shape is illustrated with an array of dies 62 on its front side. The wafer 60 is generally made of a ceramic-like material, such as $Al_2O_3TiC$ which is also herein referred to as a substrate. Each die 62 of the wafer 60 corresponds to a slider device 47 such that the backside of the wafer 60 becomes the leading edge surface 57 of the slider 47. In a preferred manufacturing sequence, the read/write element 50 is formed by deposition processes onto the front side of the wafer 60 which forms the trailing edge surface 55 of the slider 47. Thereafter, the wafer 60 is turned over to reveal its backside for a subsequent serialization process.

Figure 4:
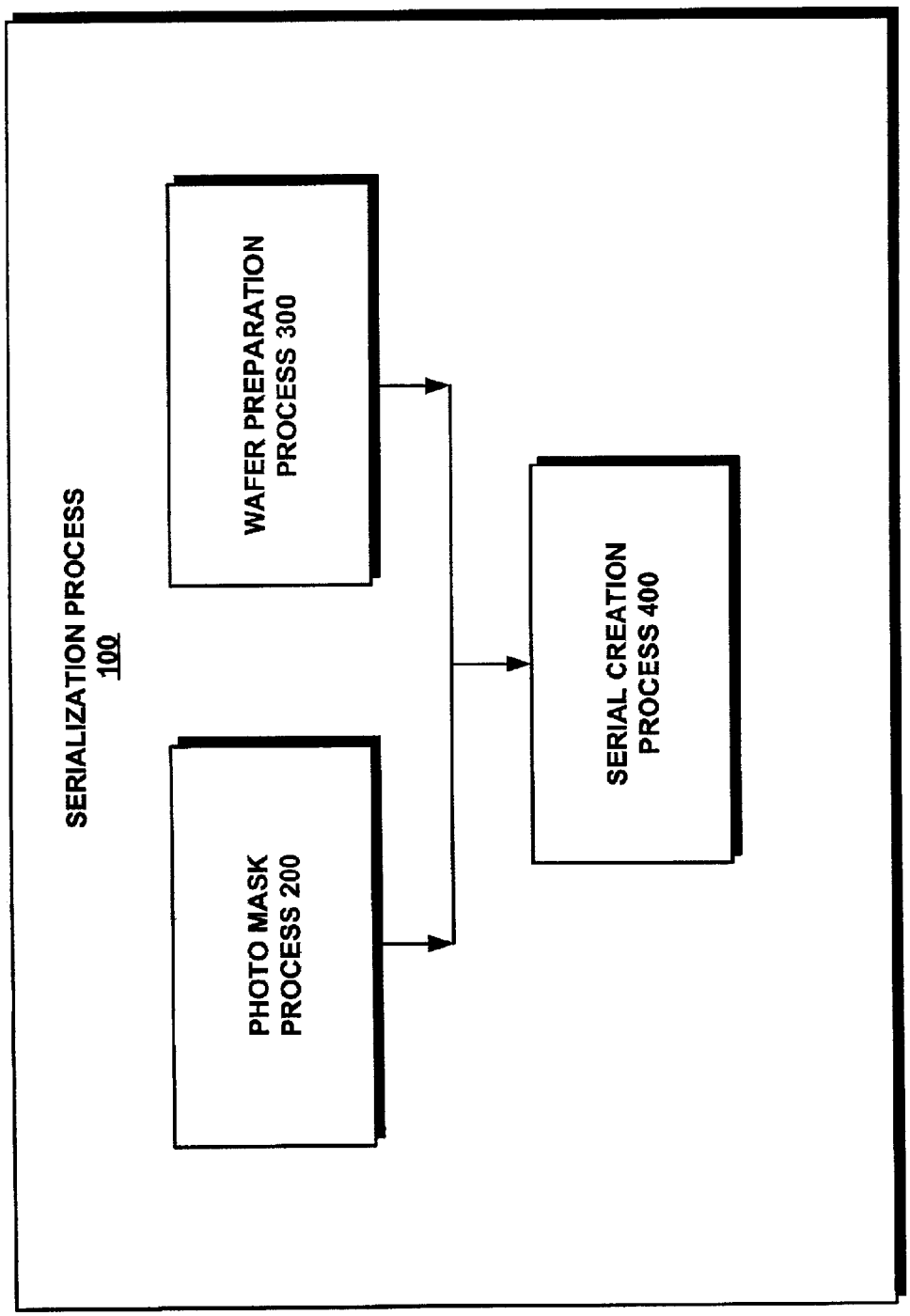
FIG. 4 is a overall process flow chart of the serialization process of the present invention for the wafer of FIG. 3.

Referring now to FIG. 4, a serialization process 100 of the present invention is comprised of three sub-level processes: a photomask process 200, a wafer preparation process 300, and a serial number creation process 400. In general, the photomask process 200 describes the procedures of creating a non-rigid photomask that incorporates the character specifications for the serialization process 100.

The wafer 60 undergoes various preparation steps in accordance with the wafer preparation process 300 before the application of the photomask for serialization. The serial number creation process 400 describes the exposure and development process after the application of the photomask, and the optical contrast enhancement process using a RIE process. Each of these three processes will now be described in more detail.

Figure 5:
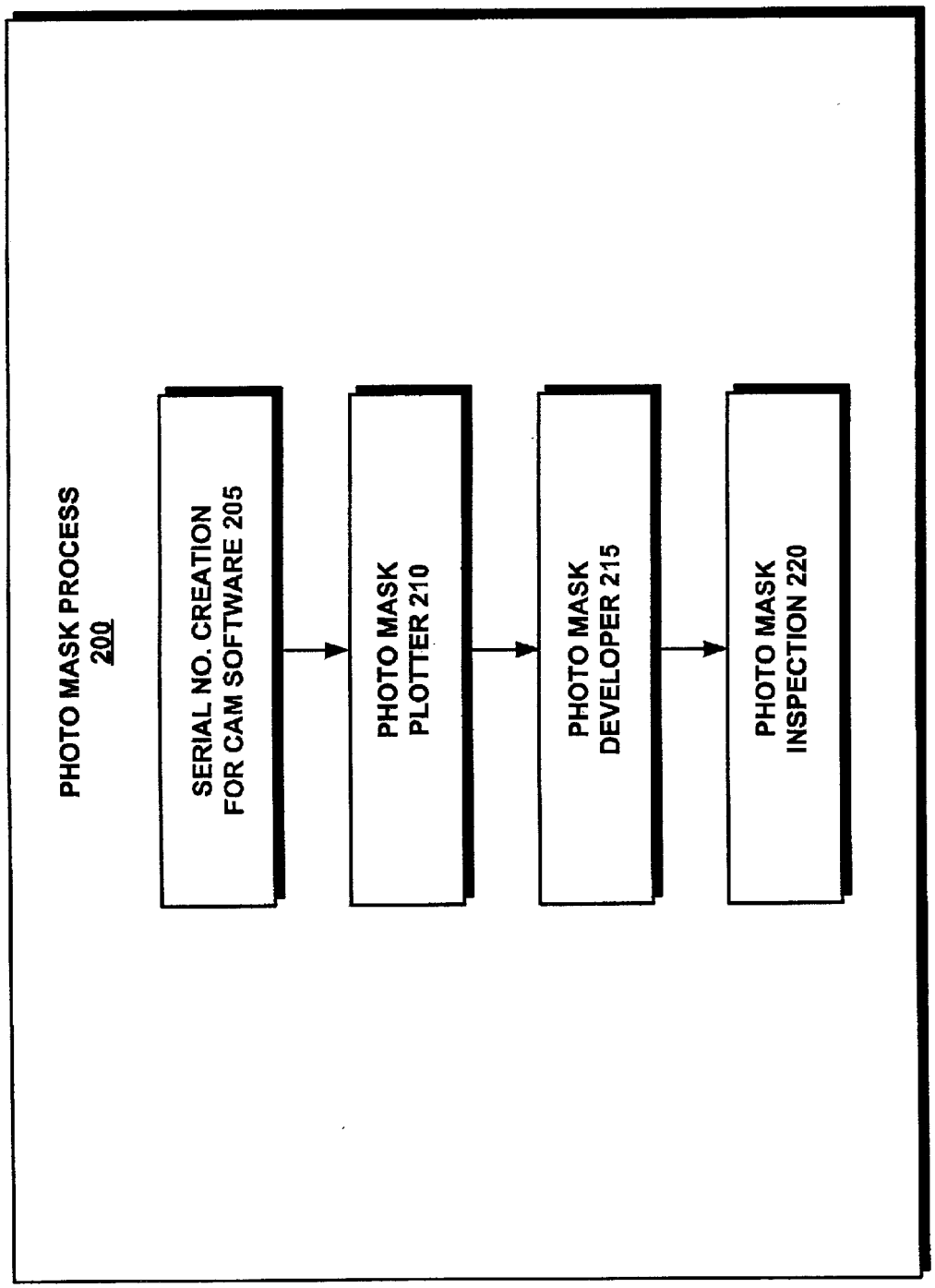
FIG. 5 is a photomask process flow chart of the serialization process of the present invention of FIG. 4.
Figure 6:
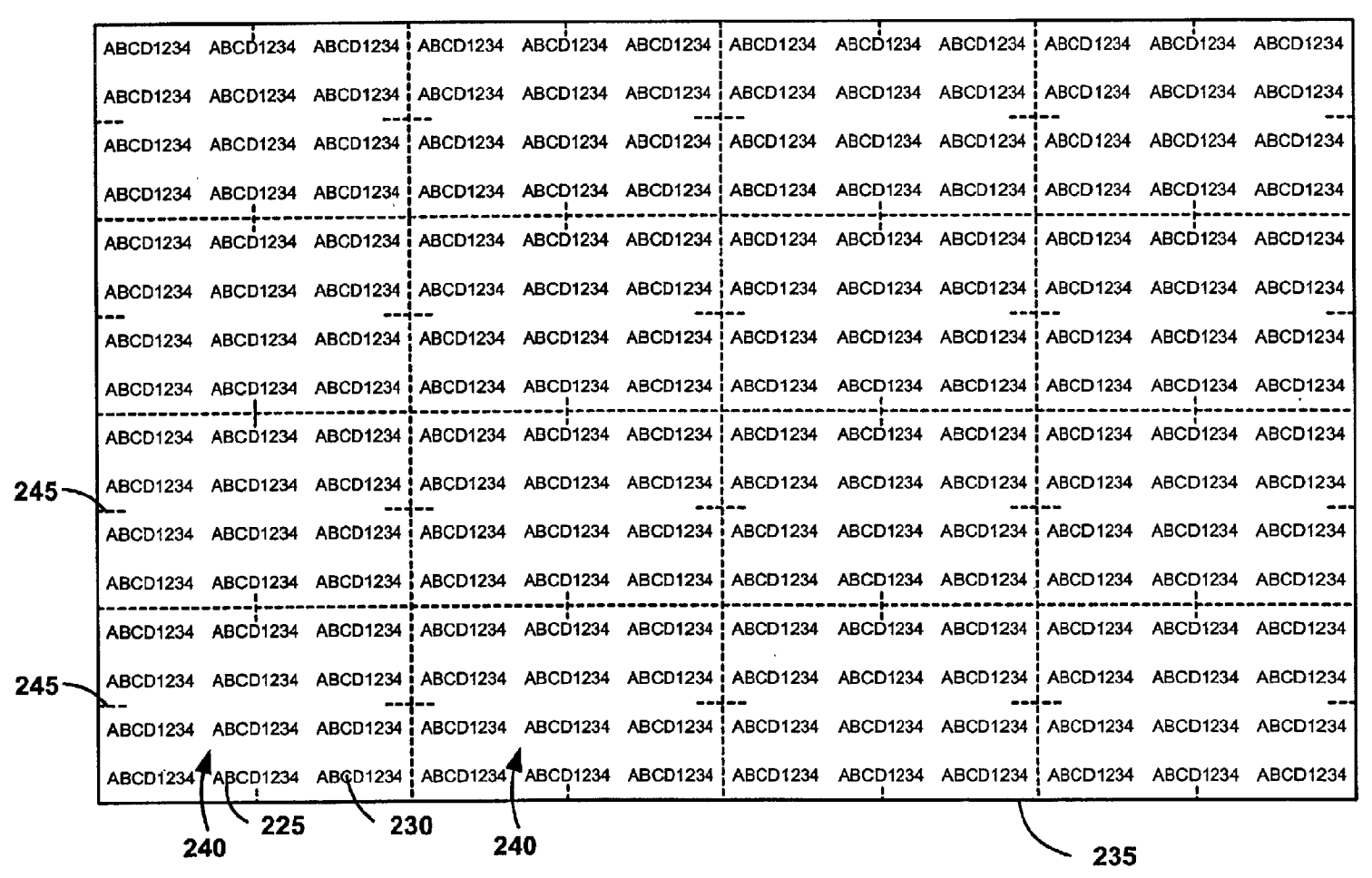

With reference to FIGS. 5 and 6, the photomask process 200 is generally comprised of four steps or blocks. Process 200 is initiated at step 205 band involves the creation of the character specifications for the serialization process 100. The character specifications are generated as a series of characters 225 representing an array of serial numbers 230 to be imprinted onto the array of dies 62 of the wafer 60 on a computer workstation using a Computer Aided Mechanical design software (CAM).

The serial numbers 230 illustrated in FIG. 6 are depicted by the designation "ABCD1234" to indicate that these serial numbers are comprised of a sequence of alphanumeric characters, in English or in any other language. Though these serial numbers could be identical, it should be clear that they are not necessarily so, and a sequential numbering or designation representation can be used. In addition, the serial numbers 230 could include designations other than alphanumeric, such as icons or pictures.

With reference to FIG. 5, the next step 210 in the photomask process 200 is for the character specifications created on the computer workstation to be printed out onto a sheet of flexible, non-rigid film 235 (FIG. 6) using, for example, a photomask plotter. The film 235 is generally made of a transparent polymer web such as Ester-based materials, upon which one surface is coated with a photographic-film material composed of light-sensitive chemical, such as a silver-halide emulsion that can be developed into an image upon exposure to a light source. The film 235 is larger than the size of the wafer 60.

Figure 7:
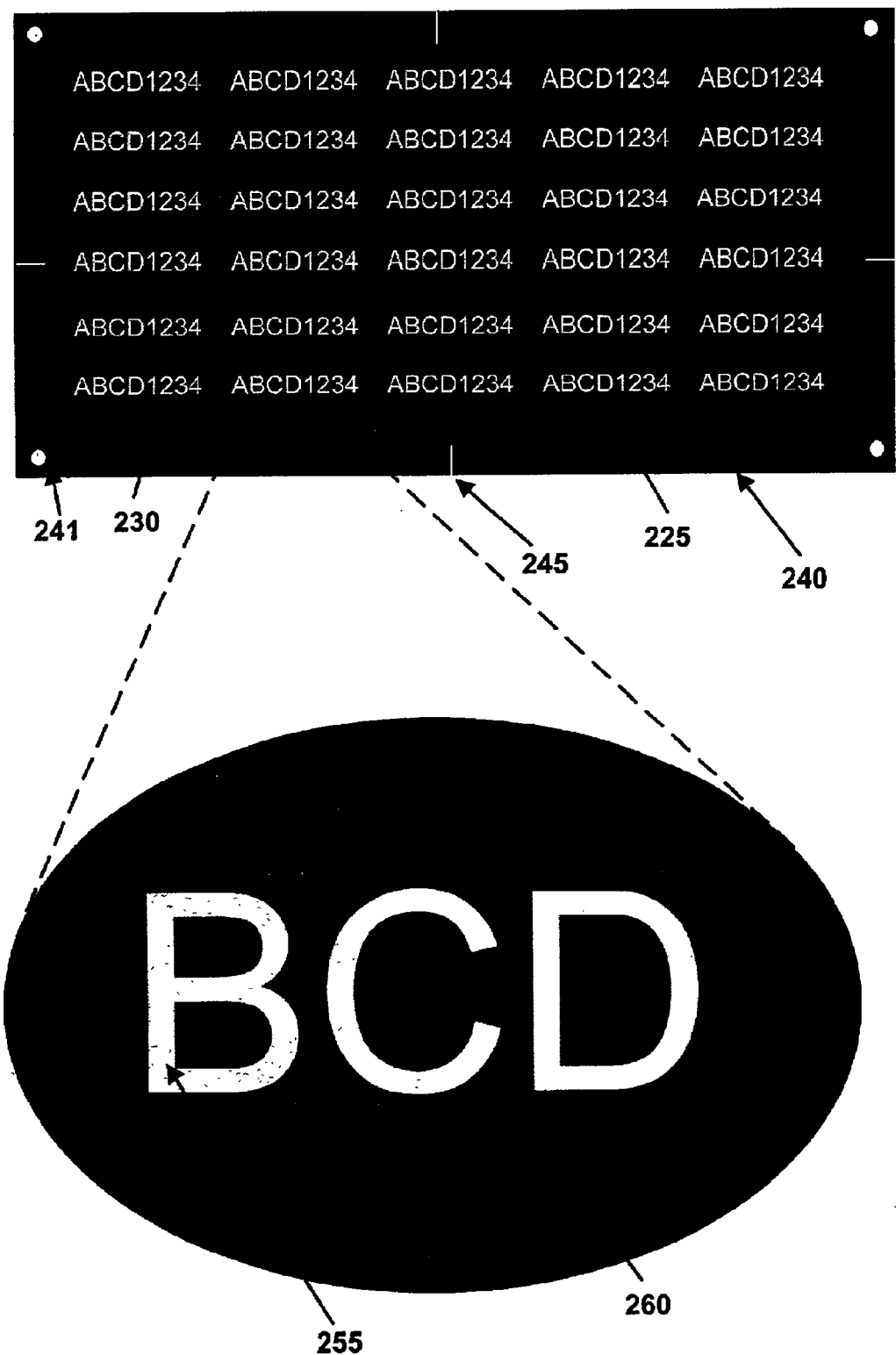
FIG. 7 is a typical character pattern on the photomask developed according to the photomask process of FIG. 5.

Upon printing the serial numbers 230 onto the film 235, the film 235 is marked and then cut along the vertical and horizontal dotted lines, into individual photomasks 240. Next, a vacuum pathway 241 (FIG. 8) is created at each corner such as a small hole or notch. Each photomask 240 has an array of serial numbers 230 and a set of alignment marks 245. The non-rigid photomask 240 is preferably slightly larger in size than the wafer 60 onto which the photomask 240 is to be applied (FIG. 7).

For illustration purposes, the foregoing description assumes the use of a positive acting photoresist on the wafer. One may choose to use a negative acting photoresist and must also reverse the polarity of the masks as described below. At step 215 of FIG. 5, a photomask developer system applies a developer chemical onto the photomasks 240 that have been pattern-exposed by the photomask plotter 210. The developer chemical is then washed away with the unexposed silver emulsion from the photomask 240 to leave an optical stencil of the negative character image 260. FIG. 7 illustrates a negative character image 225 that is formed by a transparent character area 255 surrounded by an opaque area 260 to allow light to transmit through to enable the formation of the corresponding character 225 onto the wafer 60 during the serial number creation process 400.

Step 220 of FIG. 5 includes the inspection of the photomask 240 for the presence of proper alignment marks 245 and serial numbers 230. The photomask 240 can either be accepted or rejected at this stage based on the inspection criteria.

Upon acceptance by the inspection step 220, the photomask 240 is transferred to a photomask holder 265, and as such will be further described in details subsequently. In a typical conventional serialization such as the photolithography serialization method of a prior art, the photomask itself is usually made of a rigid material such as glass onto which serial numbers 230 are created. The rigidity of the photomask of the prior art is necessary in order to provide a firm and planar surface for a proper photolithographic character image transfer onto the wafer 60. The rigid photomask of the prior art is typically expensive to make and is not reusable due to the uniqueness of the serial numbers formed thereon. In the present invention, the photomask 240 is made of an inexpensive, non-rigid photographic film 235 but is able to provide a firm surface for a proper photolithographic character image transfer using the novel photomask holder 265.

Figure 8:
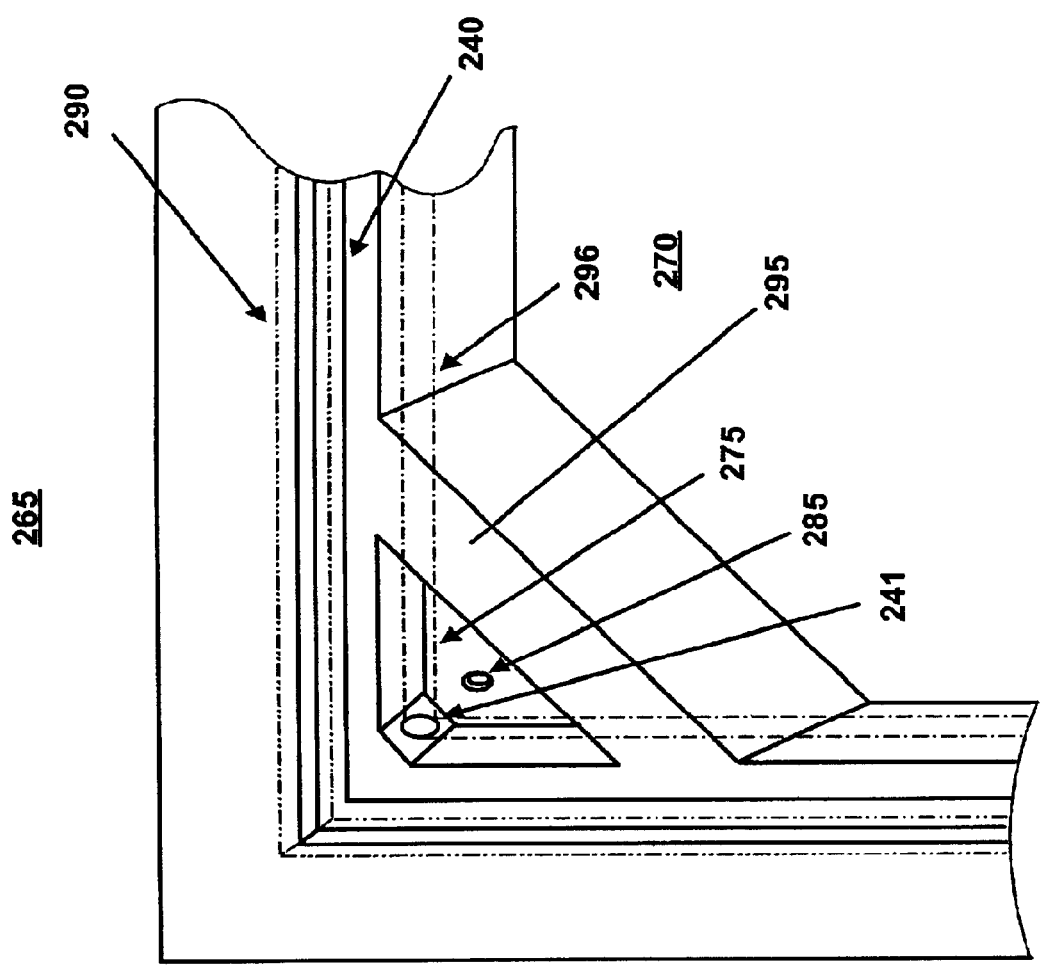
FIG. 8 is a top, fragmentary, corner view of a photomask holder for securing the non-rigid (or flexible) photomask developed according to the photomask process of FIG. 5, showing a photomask and a glass plate.
Figure 8A:
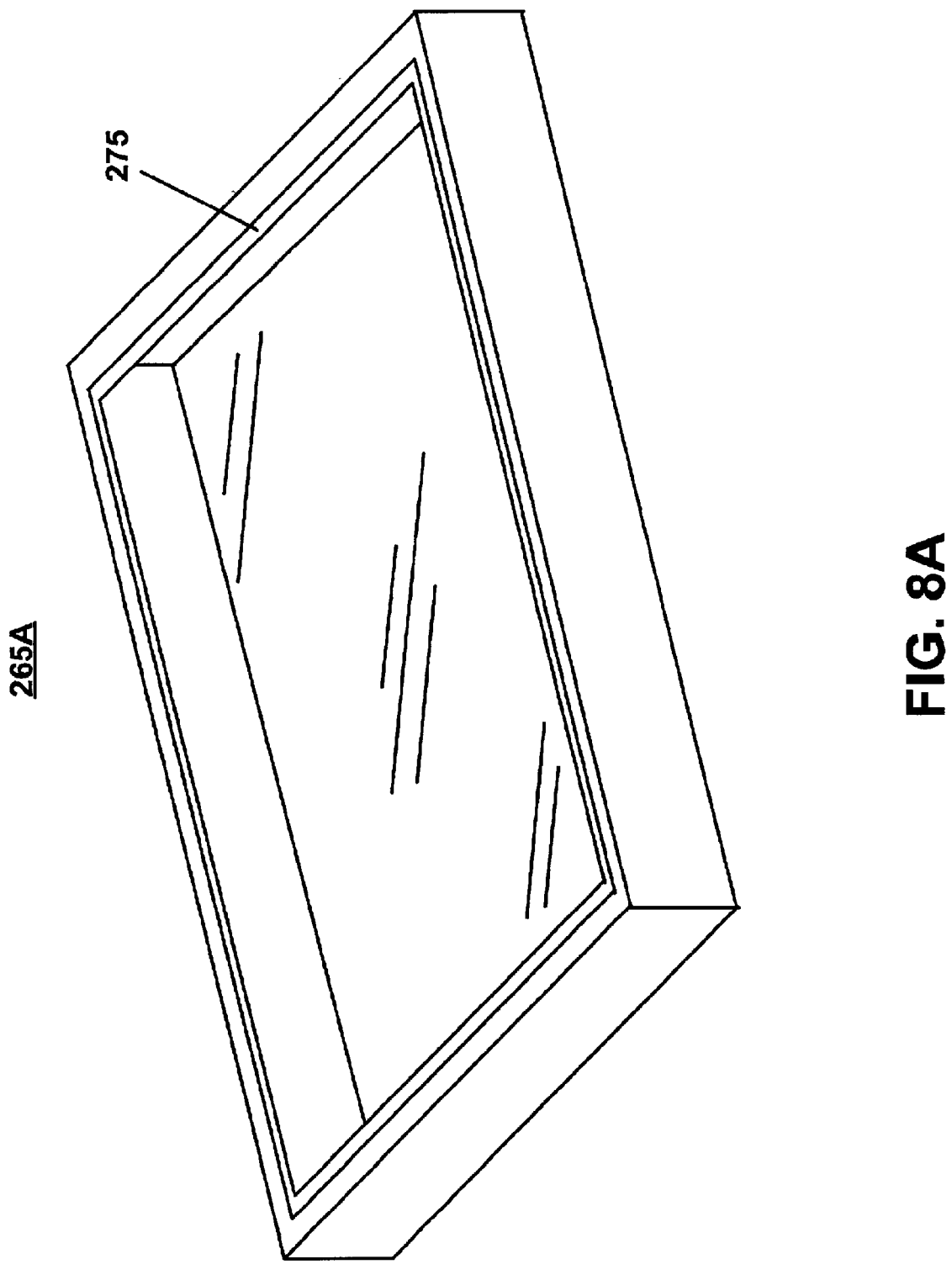
FIG. 8A is a perspective view of a photomask holder for securing the non-rigid (or flexible) photomask developed according to the photomask process of FIG. 5.

With reference to FIG. 8, the photomask holder 265 is generally a rectangular stage of a dimension slightly larger than the photomask 240 (the general shape of the photomask holder 265 is illustrated in FIG. 8A). Though the holder 265 is described as being generally rectangularly shaped with four corners, it should be clear that the holder 265 could have other shapes, with an appropriate number of corners, or vacuum positions if no corners are provided.

An opening 270 of a shape comparable to that of the wafer and slightly larger is formed at the center. Located at each of the four corners of the opening 270 in the photomask holder 265 is a vacuum pocket 275. Preferably, four vacuum pockets 275 are oppositely disposed to those of a glass plate 290 shown in dashed line that is seated on a ledge 295. The ledge 295 holds the glass plate 290 and the photomask 240.

The glass plate 290 is specially selected for mechanical rigidity, optical flatness, optical clarity, and transmittance of light in the ultraviolet spectrum. The glass plate 290 has a continuous trough 296 along the periphery that connects to the vacuum pockets 275 of the photomask holder 265. As vacuum is supplied, the pockets 275 hold the glass plate 290 in place on the holder 265, and supply vacuum to the trough 296 of the glass plate 290, in order to give a depression of a rectangular shape that is formed along the periphery of the glass 290, thus holding the photomask 240 rigidly in place against the glass plate 290.

The pockets 275 are connected to a vacuum source (not shown) through ports 285 that are preferably formed in each corner of the holder 265. During the serial number creation process 400 of FIG. 10, the photomask 240 is placed against the vacuum pockets 275 of the photomask holder 265 and the trough 296 of the glass plate 290 with its four corners resting on, and covering the vacuum pockets 275 and the trough 296.

As vacuum is applied to a vacuum opening or port 285, vacuum is supplied to the vacuum pockets 275, passes through the photomask pathways 241 connecting to the trough 296 of the glass plate 290, pulling down the photomask 240 securely against glass plate 290 and the vacuum pockets 275. The vacuum pathways 241 are aligned with the vacuum trough 296 to establish vacuum communication therewith.

Since the photomask 240 is flexible, the pockets 275 and the trough 296 essentially create a hermetic seal to rigidly secure the photomask 240 onto the photomask holder 265 and glass plate 290. The photomask 240 now becomes sufficiently rigid to allow for a proper photolithographic character image to be transferred onto the wafer 60. Thus, the photomask holder 265 and glass plate 290 serve dual functions: to secure rigidly the photomask 240, and at the same time to enable a light source to transmit through the glass plate 290 to perform the photolithographic character image transfer. Because of the ability to adapt appropriate photomasks 240 as required by the serialization process 100, the photomask holder 265 and glass plate 290 are therefore reusable for each serialization process 100. This reusability results in a substantial reduction in the wafer manufacturing cost as compared to a conventional serialization process.

FIG. 8A illustrates an alternative photomask holder 265A that is generally similar to the photomask 265 of FIG. 8, with the exception that the alternative photomask holder 265A does not include a vacuum port 285. It should also be clear that the photomask holder 265 or 265A can be shaped to correspond to the shape of the shape of the photomask 240 that can assume various shapes and dimensions.

Figure 9:
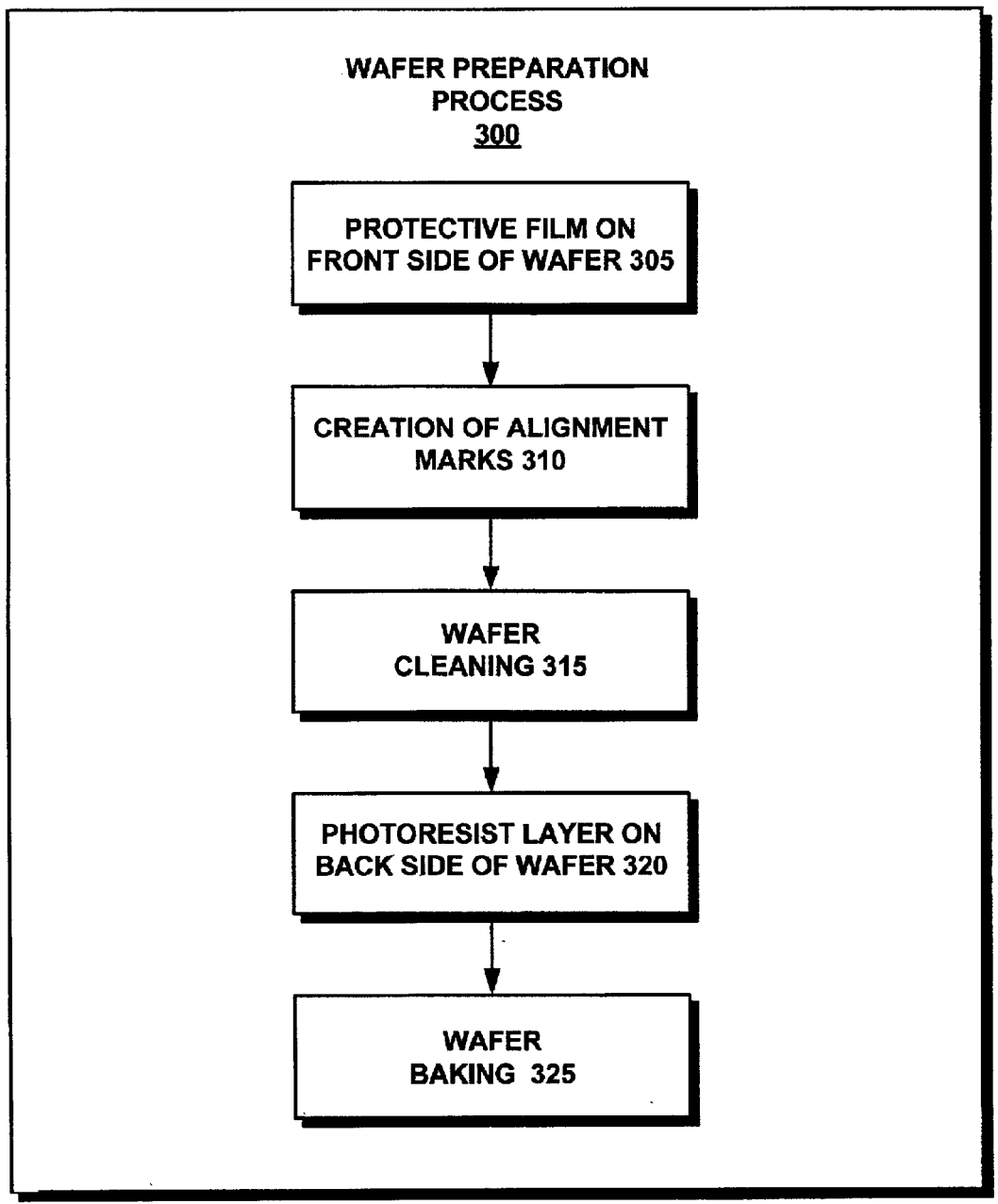
FIG. 9 is a wafer preparation flow chart for the serialization process of the present invention of FIG. 4.

Referring now to FIG. 9, the wafer preparation process 300 is comprised of 5 steps that are performed in conjunction with the photomask process 200. In general, the wafer 60 is prepared in advance prior to the serial number creation process 400. The first step 305 involves an application of a thick protective photoresist film onto the front side of the wafer 60, whereupon an array of read/write elements 50 are formed on the dies 62. The wafer 60 is then turned over on its backside for the subsequent wafer preparation processing steps.

The next step 310 is the creation of alignment marks and inspection locations onto the backside of the wafer 60. A series of cross-hair marks are imprinted onto the backside of the wafer 60 to coincide with the alignment marks 245 of the photomasks 240 in a proper orientation with respect to the array of sliders 47 on the front side of the wafer 60. Alternatively, this imprinting can be created earlier in the processing of the wafer 60, for example, in conjunction with the orientation mark imprinting for the first masking layer of the read/write elements which establish the array of dies 62 on the front side of the wafer.

Thereafter, the prepared wafer 60 undergoes a thorough cleaning process at step 315. Preferably, the prepared wafer substrate 60 is subjected to cleaning with the chemical solvents to remove the contamination such as particles, organic oil, etc. before applying the photoresist material on the backside of the wafer 60. The chemical solvents used can be 1-Methyl-2-pyrrolidone, Acetone, Isopropyl alcohol, and De-Ionized water.

At the next step 320, a thin layer of photoresist 330 is applied uniformly on the backside of the wafer 60. A common photoresist material is made of a liquid compound which is composed of 2 main components base materials: Diazo Photoactive Compound and Novolak Resin, that is about 1.5 to 50 microns in thickness. Such resists are known as positive-acting resists. Negative-acting resists, though consisting of different chemistries, are equally suited for this application. For the sake of simplicity, only the positive-acting resist process will be included in the following process descriptions. Because of their light sensitivity, the photoresist materials are suitable for use in the photolithographic character image transfer in the subsequent serial number creation process 400.

At step 325, the wafer 60 with the photoresist layer 330 undergoes a curing process whereby the wafer 60 is baked in a curing oven at an elevated temperature of 200 to 250 degrees F. for 45 to 90 minutes. Upon curing, the photoresist layer 330 becomes solidified as a result of the solvent removal and it also helps decrease-the stress in the photoresist film.

Figure 10:
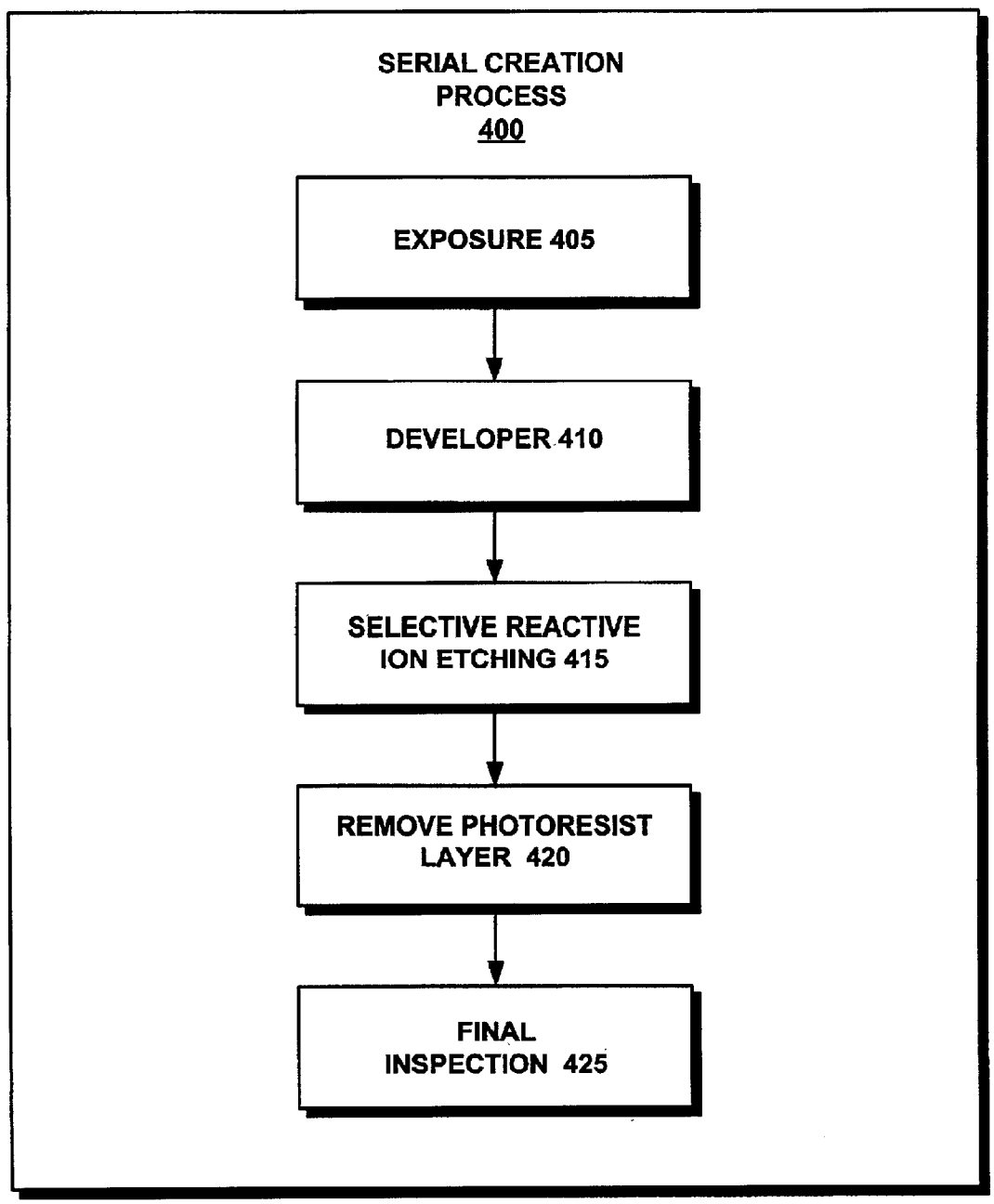
FIG. 10 is a serial creation process flow chart of the serialization process of the present invention of FIG. 4.

With reference to FIG. 10, the third process is the serial number creation process 400 which is comprised of 5 basic steps. Upon the availability of the photomask 240 developed from the photomask process 200 and the wafer 60 prepared in accordance with the wafer preparation process 300, the first step 405 involves placing and aligning the assembly described above which includes the photomask holder 265, the photomask 240 and the glass plate 290, to the cross hairs on the backside of the wafer 60 substrate with the photoresist layer 330 and exposing an ultraviolet (UV) light source through the photomask 240 and glass plate 290 to create a pattern of characters 225 that form an array of serial numbers 230.

With further reference to FIGS. 11A and 11B, when a UV light 460 is transmitted from a source above the photomask holder 265, the UV light 460 enters through the glass plate 290 of the photomask holder 265 and then through the photomask 240. As UV light is transmitted through the photomask 240, the opaque areas 260 prevent light transmission while the transparent areas 255 that define the characters 225 allow the UV light 460 to pass through, thereby exposing the underlying photoresist layer 330 on the backside of the wafer 60. The photomask 240 is held in place against the glass plate 290 by vacuum supplied to the trough 296 of the glass plate 290.

Upon exposing the photoresist layer 330 to the UV light, the next step 410 of FIG. 10 involves a photolithographic development of the exposed photoresist layer 330. With reference to FIG. 11C, a developer chemical is applied to the photoresist layer 330 on the backside 446 of the wafer 60. The developer chemical interacts in a highly selective manner with the exposed photoresist materials of the photoresist layer 330 that represent characters 225, forming serial numbers 230. The developer chemical and the exposed photoresist materials are then washed away, exposing a pattern of characters 225 on the underlying areas 435 of the backside 446 of the wafer 60.

After the pattern of characters 225 is formed on the underlying area 435, the wafer 60 undergoes, at step 415 of FIG. 10, a process according to the present invention known as selective Reactive Ion Etching (RIE) process 415. In general, a RIE process is a chemically reactive process to remove or etch material by means of a chemical reaction without heat, However, unlike a conventional RIE process that etches a substrate uniformly, the selective RIE process 415 of the present invention utilizes a plasma chemistry that selectively etch one of the two components of the ceramic substrate of the wafer 60 with the selected etch rate.

Preferably, the ceramic substrate of the wafer 60 is composed of $Al_2O_3$ and TiC (titanium carbide). The selective RIE process 415 of the present invention has the ability to adjust the plasma chemistry so as to effect the different chemical reaction with the titanium carbide and the aluminum oxide at the atomic level. The chemical reaction causes a chemical change in the titanium carbide and aluminum oxide from the non-volatile compounds into a volatile compounds that are then removed as a by-product in the process chamber under vacuum. The final etching result on the substrate will form the characters with a high optical contrast without deep debris trenches.

Figure 12:
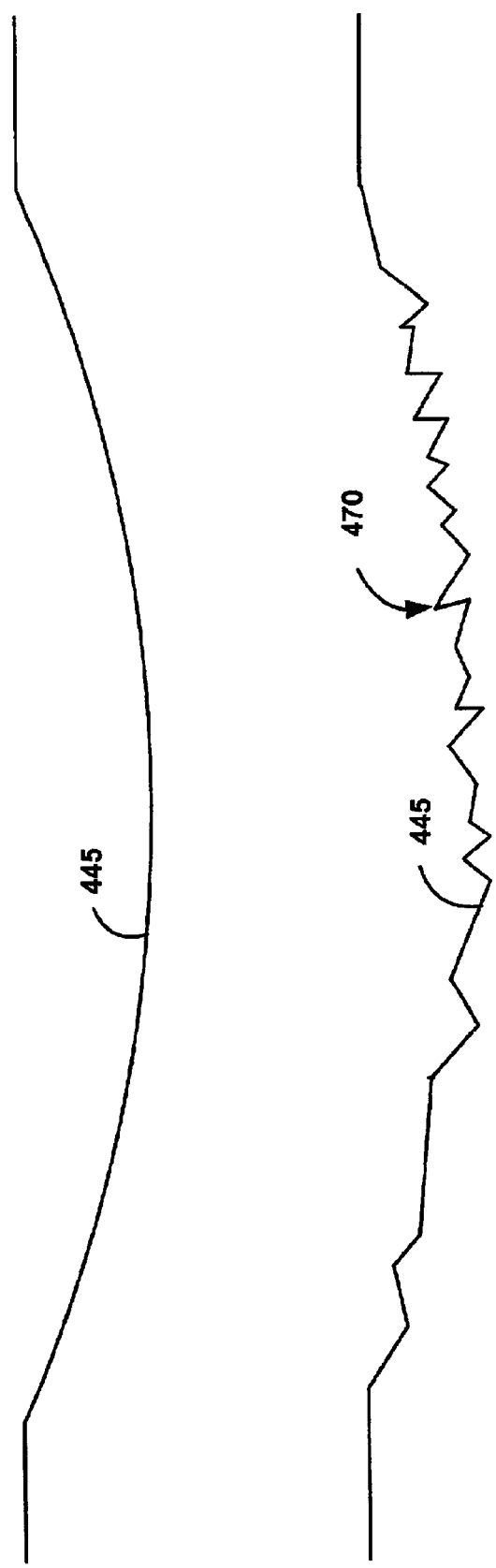
FIG. 12 is a cross-section view of a trench formed by a typical character impression on the wafer of FIG. 3 undergoing an RIE process.

Referring now to FIGS. 11D, 11E, and 12, after the development step 410, a smooth but shallow trench 445 is formed in the underlying area 435 of the characters 225. The smooth surface of the trench 445 will have, in general the same light reflectivity as the ceramic substrate of the wafer 60, upon the subsequent removal of the photoresist layer 330. As a result, the optical contrast of the characters 225 formed on the backside of the wafer 60 is not quite optimal, thereby rendering the serial number 230 less recognizable by automated processes such as Optical Character Recognition (OCR).

In order to improve the optical contrast of the characters 225, the selective RIE process 415 is applied to the trench 445 to remove the titanium carbide and aluminum oxide compounds from the ceramic substrate of the wafer 60 without causing an undesirable increase in depth of the trench 445. The plasma 470 generated by the selective RIE process 415 reacts with both the titanium carbide and aluminum oxide compounds with the different selective etch rate to effect a phase change into a volatile compound, which is then removed as a by-product. The chemistry of the RIE process is adjusted to preferentially etch the Titanium carbide component of the ceramic at a ratio of at least 2:1 to that of the Aluminum oxide, more preferably at a ratio of 10:1 or higher. As a result, the surface of the trench 445 becomes roughened due to the preferential removal of the titanium carbide to the aluminum oxide compounds, which improves the optical contrast to the smooth surface of the surrounding ceramic substrate of the wafer 60. Furthermore, the etch process is essentially self-terminating to a depth on the order of the average particle size of the Titanium carbide component of the ceramic wafer 60

This change in the surface roughness correspondingly causes a significant change in the light reflectivity in the trench 445 as compared to the surrounding ceramic substrate of the wafer 60, thus substantially increasing the optical contrast of the character 225 that is formed by the trench 445. Hence, this increased optical contrasts enhances the ability for automated processes such as OCR to recognize the serial number 230.

In contrast with the selective RIE process 415, if a non-selective RIE process were to be applied to the trench 445, the optical contrast would have been limited because all the compounds in the substrate will be removed with the same etch rate, rendering the optical contrast less than optimal for the OCR process. Thus, the selective RIE process 415 is superior to a conventional RIE process in its ability to provide a strong optical contrast of the characters 225 without causing a deep trench as in the conventional laser scribing method.

Preferably, the depth of the trench 445 is about 0.12 $\mu$m and an roughness average (Ra) of 0.5 $\mu$m or more versus 2 to 40 $\mu$m and greater in the conventional laser scribing method. Furthermore, the selective RIE process 415 does not generate debris on the backside 446 of the wafer 60 nor create surface features that can entrap and entrain debris, thus eliminating the need for aggressive and potentially damaging cleaning processes as in a conventional serialization process such as the laser scribing method. Moreover, because the selective RIE process 415 does not involve heat and because the material removal is small as compared to a conventional serialization process such as the laser scribing method, the flatness of the wafer is generally unaffected. Additionally, the physical features of this shallow trench 445 are not as liable to entrap and entrain process chemicals and debris from process. This further benefits the efficacy of subsequent cleaning process substantially reducing the risk of slider/disk crashes associated with disk drive product reliability issues.

With reference to FIG. 10E, at step 420 of FIG. 10, after performing the selective RIE process 415 on the wafer 60, the photoresist layer 330 on the backside 446 and the protective photoresist layer on the front side of the wafer 60 are stripped away from the underlying ceramic substrate of the wafer 60, thus leaving newly created serial numbers 230 clearly discernible on the backside 446 of the wafer 60.

At step 425 of FIG. 10, the wafer 60 is inspected for the presence of proper serial numbers 230 before proceeding to subsequent manufacturing processes.

In summary, the serialization process 100 of the present invention represents in particular a novel and manufacturing efficient method for creating serial numbers on a ceramic semiconductor-like wafer 60 by means of a photomask process 200 involving photomask 240 and photomask holder 265, and the serial number creation process 400. The photomask process 200 enables a rapid creation of serial numbers 230, while the selective RIE process 415 substantially increases the optical contrast of the characters 225 without the need for deep trenches. It should be understood that the serialization process 100 of the present invention can be readily extended to a wide range of applications involving serialization of a wafer-like substrate such as the wafer 60.

It should also be understood that the geometry, compositions, and dimensions of the elements described herein can be modified within the scope of the invention and are not intended to be the exclusive; rather, they can be modified within the scope of the invention. Other modifications can be made when implementing the invention for a particular environment.

What is claimed is:

1. A serialization process for creating serial numbers on a semiconductor wafer that is subdivided into dies, comprising:

forming a non-rigid photomask that incorporates character specifications for the serial numbers;

retaining the non-rigid photomask in a photomask holder to enable handling of the photomask as a rigid structure;

preparing the wafer;

creating serial numbers onto the dies using a combined process involving photolithography, and a reactive ion etching process with a selective etch rate;

wherein the wafer is formed of at least two compounds; and wherein creating the serial numbers comprises using the reactive ion etching process to selectively etch the at least two compounds at different rates for creating a phase change between the at least two compounds, in order to provide improved visual contrast between the serial numbers and surrounding areas of the dies.

2. The serialization process of claim 1, wherein the at least two compounds comprise aluminum oxide and titanium carbide; and wherein creating the serial numbers comprises effecting different chemical reactions with the titanium carbide and the aluminum oxide at an atomic level to cause the phase change in the aluminum oxide and titanium carbide.

3. The serialization process of claim 1, wherein forming the photomask comprises defining the character specifications as a series of characters using a Computer Aided Mechanical design software.

4. The serialization process of claim 1, wherein forming the photomask comprises laser printing the photomask on a non-rigid photographic-film.

5. The serialization process of claim 4, wherein forming the photomask further comprises loser printing the serial numbers onto the non-rigid photographic-film.

6. The serialization process of claim 5, wherein forming the photomask further comprises forming any of a negative or positive character image of the serial numbers.

7. The serialization process of claim 6, wherein forming the photomask further comprises inspecting the photomask including the serial numbers.

8. The serialization process of claim 1, wherein preparing the wafer comprises applying a protective photoresist film onto a front side of the wafer.

9. The serialization process of claim 8, wherein preparing the wafer further comprises creating alignment marks and inspection locations onto a backside of the wafer.

10. The serialization process of claim 9, wherein preparing the wafer further comprises cleaning the wafer.

11. The serialization process of claim 10, wherein preparing the wafer further comprises applying a photoresist layer on the backside of the wafer.

12. The serialization process of claim 11, wherein creating the serial numbers comprises exposing the photoresist layer to UV light to create a pattern of characters that form an array of serial numbers.

13. The serialization process of claim 12, wherein creating the serial numbers further comprises photolithographically developing the photoresist layer.

14. A photomask system for use in a serialization system to create serial numbers on a semiconductor wafer that is subdivided into dies, comprising:

a non-rigid photomask that incorporates character specifications for the serial numbers;

a photomask holder that retains the non-rigid photomask to enable handling of the photomask as a rigid structure;

wherein the serial numbers are created onto the dies using a combined process involving photolithography, and a reactive ion etching process with a selective etch rate;

wherein the wafer is formed of at least two compounds; and wherein the serial numbers are created using the reactive ion etching process to selectively etch the at least two compounds at different rates for creating a phase change between the at least two compounds, in order to provide improved visual contrast between the serial numbers and surrounding areas of the dies.

15. The photomask system of claim 14, wherein the photomask holder comprises a mask holder stage.

16. The photomask system of claim 15, wherein the photomask holder comprises a top opening that is oppositely disposed relative to a gloss plate.

17. The photomask system of claim 16, wherein the photomask holder comprises a vacuum trough that is formed continuously along a periphery of the top opening to allow the photomask to be securely retained by the glass plate.

18. The photomask system of claim 14, wherein the at least two compounds comprise aluminum oxide and titanium carbide; and wherein the serial numbers are created by effecting different chemical reactions with the titanium carbide and the aluminum oxide at an atomic level to cause the phase change in the aluminum oxide and titanium carbide.

19. The photomask system of claim 14, character specifications are formed by a series of characters using a Computer Aided Mechanical design software.

20. The photomask system of claim 14, wherein the photomask is formed by laser printing the photomask on a non-rigid photographic-film.

21. The photomask system of claim 20, wherein the photomask is formed by laser printing the serial numbers onto the non-rigid photographic-film.

22. The photomask system of claim 21, wherein the photomask comprises any of a negative or positive character image of the serial numbers.

23. The photomask system of claim 14, further comprises a protective photoresist film that is applied onto a front side of the wafer.

24. The photomask system of claim 23, wherein the wafer further comprises alignment marks and inspection locations onto a backside of the wafer.

25. The photomask system of claim 24, wherein the wafer further comprises a photoresist layer that is applied on the backside of the wafer.

26. The photomask system of claim 23, wherein the serial numbers are formed by exposing the photoresist layer to UV light to create a pattern of characters that form an array of serial numbers.

27. The photomask system of claim 26, wherein the serial numbers are created by photolithographically developing the photoresist layer.

* * * * *